United States Patent [19]
Rostoker et al.

[11] Patent Number: 5,631,581
[45] Date of Patent: May 20, 1997

[54] MICROELECTRONIC INTEGRATED CIRCUIT INCLUDING TRIANGULAR SEMICONDUCTOR "AND" GATE DEVICE

[75] Inventors: Michael D. Rostoker, Boulder Creek; James S. Koford, Mountain View; Ranko Scepanovic, San Jose; Edwin R. Jones; Gobi R. Padmanahben, both of Sunnyvale; Ashok K. Kapoor, Palo Alto, all of Calif.; Valeriy B. Kudryavtsev, Moscow, Russian Federation; Alexander E. Andreev, Moskovskata Oblast, Russian Federation; Stanislav V. Aleshin; Alexander S. Podkolzin, both of Moscow, Russian Federation

[73] Assignee: LSI Logic Corporation, Milpitas, Calif.

[21] Appl. No.: 567,952

[22] Filed: Dec. 6, 1995

Related U.S. Application Data

[63] Continuation of Ser. No. 438,613, May 10, 1995, abandoned.

[51] Int. Cl.⁶ .................................................. H03K 17/093
[52] U.S. Cl. ........................... 326/101; 326/47; 257/206; 257/335
[58] Field of Search ..................................... 257/206, 335, 257/336, 339; 326/41, 47, 101

[56] References Cited

U.S. PATENT DOCUMENTS

| 4,148,047 | 4/1979 | Hendrickson | 257/339 X |
| 4,777,521 | 10/1988 | Coe | 257/339 |
| 5,394,030 | 2/1995 | Jennings, III et al. | 326/41 |

*Primary Examiner*—David R. Hudspeth
*Attorney, Agent, or Firm*—Poms, Smith, Lande & Rose

[57] ABSTRACT

A microelectronic integrated circuit includes a semiconductor substrate, and a plurality of microelectronic devices formed on the substrate. Each device has a periphery defined by a triangle, and includes an active area formed within the periphery. First and second terminals are formed in the active area adjacent to two vertices of the triangle respectively, and first to third gates are formed between the first and second terminals. The gates have contacts formed outside the active area adjacent to a side of the triangle between the two vertices. The power supply connections to the first and second terminals, the conductivity type (NMOS or PMOS), and the addition of a pull-up or a pull-down resistor are selected for each device to provide a desired AND, NAND, OR or NOR function. A third terminal can be formed between two of the gates and used as an output terminal to provide an AND/OR logic function. The devices are interconnected using three direction routing based on hexagonal geometry.

38 Claims, 8 Drawing Sheets

MICROELECTRONIC INTEGRATED CIRCUIT INCLUDING TRIANGULAR SEMICONDUCTOR "AND" GATE DEVICE

CROSS-REFERENCE TO RELATED APPLICATION

This application is a continuation of U.S. patent application Ser. No. 08/438,613, filed May 10, 1995 abandoned.

BACKGROUND OF THE INVENTION

1. Field of the Invention

The present invention generally relates to the art of microelectronic integrated circuits, and more specifically to a microelectronic integrated circuit including a plurality of triangular semiconductor "AND" gate devices which can be interconnected using three direction routing based on hexagonal geometry.

2. Description of the Related Art

Microelectronic integrated circuits consist of large numbers of semiconductor devices that are fabricated by layering several different materials on a silicon base or wafer. These devices include logic gates that provide AND, OR, NAND, NOR and other binary logic functions. Each device includes a plurality of pins or terminals that are connected to pins of other devices by electrical interconnect wire networks or nets.

Figure 1:
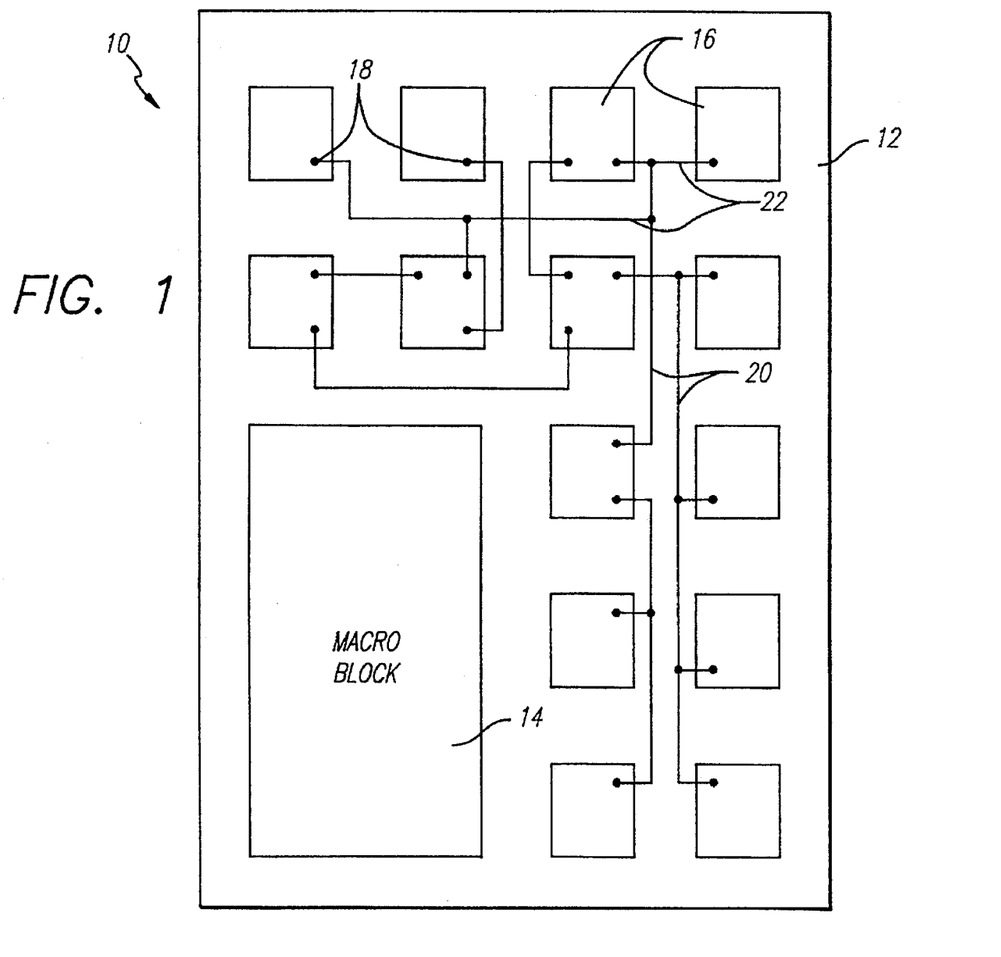
FIG. 1 is a diagram illustrating a prior art integrated circuit.

As illustrated in FIG. 1, a conventional microelectronic integrated circuit 10 comprises a substrate 12 on which a large number of semiconductor devices are formed. These devices include large functional macroblocks such as indicated at 14 which may be central processing units, input-output devices or the like. A typical integrated circuit further comprises a large number of smaller devices such as logic gates 16 which are arranged in a generally rectangular pattern in the areas of the substrate 12 that are not occupied by macroblocks.

The logic gates 16 have terminals 18 to provide interconnections to other gates 16 on the substrate 12. Interconnections are made via vertical electrical conductors 20 and horizontal electrical conductors 22 that extend between the terminals 18 of the gates 16 in such a manner as to achieve the interconnections required by the netlist of the integrated circuit 10. It will be noted that only a few of the elements 16, 18, 20 and 22 are designated by reference numerals for clarity of illustration.

In conventional integrated circuit design, the electrical conductors 20 and 22 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

SUMMARY OF THE INVENTION

In accordance with the present invention, electrical conductors for interconnecting terminals of microelectronic devices of an integrated circuit extend in three directions that are angularly displaced from each other by 60°.

The conductors pass through points defined by centers of closely packed small hexagons superimposed on the substrate such that the conductors extend perpendicular to edges of the hexagons.

The conductors that extend in the three directions can be formed in three different layers, or alternatively the conductors that extend in two or three of the directions can be formed in a single layer as long as they do not cross.

A microelectronic integrated circuit that utilizes the present three direction routing arrangement includes a semiconductor substrate, and a plurality of microelectronic devices that are formed on the substrate in a closely packed triangular arrangement that maximizes the space utilization of the circuit.

Each device has a periphery defined by a large triangle, and includes an active area formed within the periphery. First and second terminals are formed in the active area adjacent to two vertices of the triangle respectively, and first to third gates are formed between the first and second terminals.

The gates have contacts formed outside the active area adjacent to a side of the triangle between the two vertices. The first and second terminals, and the gates are connected using the three direction hexagonal routing arrangement.

The power supply connections to the central terminal and the first to third terminals, the conductivity type (NMOS or PMOS), and the addition of a pull-up or a pull-down resistor is selected for each device to provide a desired AND, NAND, OR or NOR function. A third terminal can be formed between two of the gates and used as an output terminal to provide an AND/OR logic function.

The present invention substantially reduces the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 2:
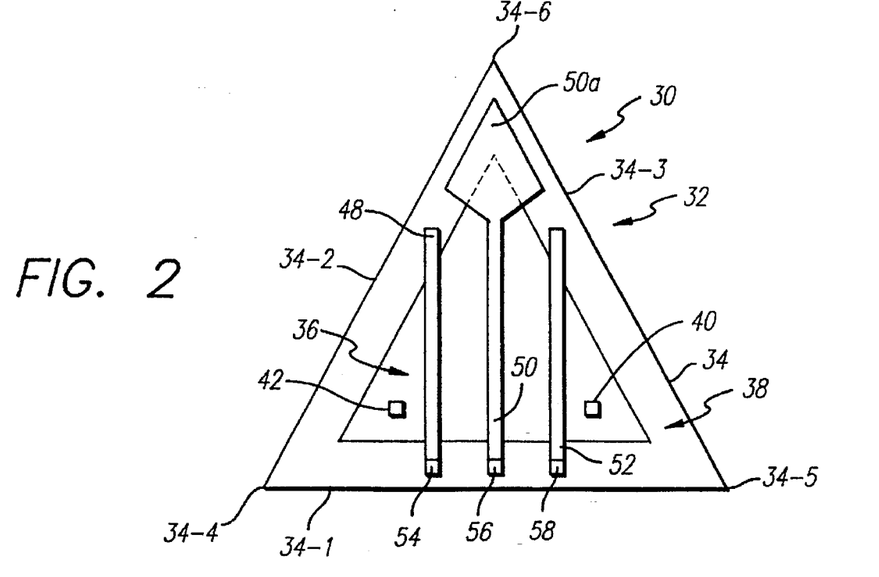
FIG. 2 is a diagram illustrating a microelectronic gate device embodying the present invention.

A semiconductor gate device for a microelectronic integrated circuit is designated by the reference numeral 30 and illustrated in FIG. 2. The device 30, in its basic form, provides a logical AND function, but can be adapted to provide a logical NAND, OR, NOR, or other logical function as will be described below.

The gate device 30 is formed on a substrate 32, and has a triangular periphery 34 including first to third edges 34-1, 34-2 and 34-3, and first to third vertices 34-4, 34-5 and 34-6 respectively in the illustrated arrangement. A triangular semiconductor active area 36 is formed within the periphery 34, and an inactive area 38 is defined between the active area 36 and the periphery 34.

The device 30 comprises a first electrically conductive electrode or terminal 40 which functions as a Field-Effect-Transistor (FET) source terminal, and a second electrode or terminal 42 which functions as an FET drain terminal. The terminals 40 and 42 are formed in the active area 36 adjacent to the first and second vertices 34-4 and 34-5 respectively. Although only one each of the terminals 40 and 42 is illustrated in the drawing, it is within the scope of the invention to provide two or more each of the terminals 40 and 42.

The device 30 further comprises first, second and third gates 48, 50 and 52 which are formed between the first and second terminals 40 and 42 respectively as illustrated. The gates 48, 50 and 52 are preferably insulated gates, each including a layer of insulating oxide with a layer of conductive material (metal or doped polysilicon) formed over the oxide in a Metal-Oxide-Semiconductor (MOS) configuration.

First to third gate electrodes or terminals 54, 56 and 58 are formed in the inactive area 38 adjacent to the triangular edge 34-1, and are electrically connected to the gates 48, 50 and 52 respectively. It will be noted that the locations of the gate terminals 54, 56 and 58 are exemplary, and that the gate terminals can be located at different points in the device in accordance with the requirements of a particular design or application.

In order to provide effective source-drain electrical isolation, the opposite end portions of each of the gates 48, 50 and 52 extend into the inactive area 38. The upper end of the gate 56 has the shape of as a solid quadrilateral which extends into the inactive area 38 as indicated at 50a. This is for the purpose of avoiding manufacturing problems which could result if the upper end of the gate 50 extended through the upper vertex of the triangular active area 36. Other layout schemes could be used to achieve this purpose of making the design immune to manufacturing tolerances.

The device 30 in its most basic form provides a logical AND function. Each gate 48, 50 and 52 controls the electrical conductivity of a respective underlying portion of an FET channel between the terminals 40 and 42 such that each gate 48, 50 and 52 can independently inhibit conduction through the channel. Signals must be applied to all of the gates 54, 56 and 58 which cause the underlying portions of the channel to become enhanced in order to enable conduction through the channel. This is an "all" or "AND" configuration.

Figure 3:
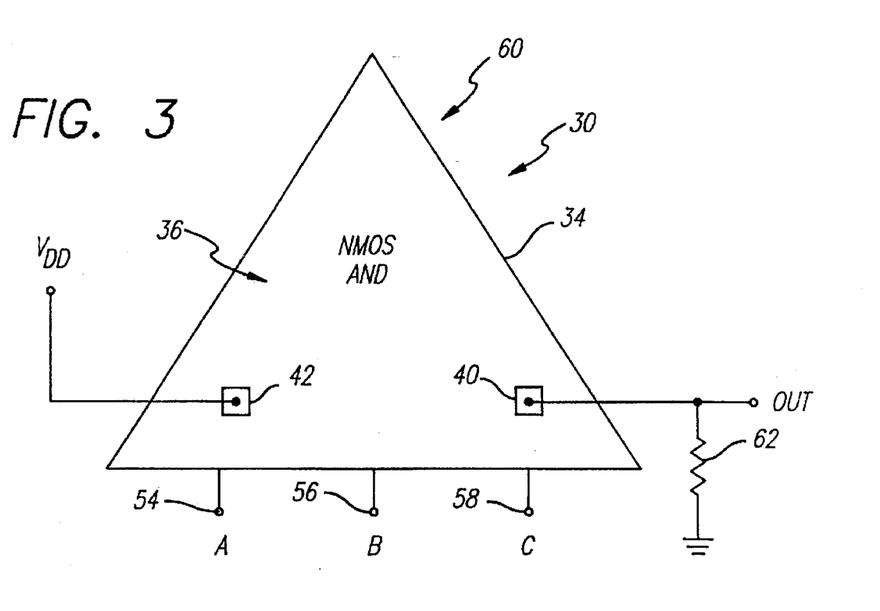
FIG. 3 is an electrical schematic diagram illustrating the present device connected to provide a logical AND function.

An AND gate 60 based on the device 30 is illustrated in FIG. 3. The device 30 is shown in simplified form for clarity of illustration, with only the triangular periphery 34 and terminals 40, 42, 54, 56 and 58 included in the drawing. Input signals A, B and C are applied to the gate terminals 54, 56 and 58 respectively, and an output signal OUT is taken at the source terminal 40.

In the AND gate 60 of FIG. 3, the active area 36 of the device 30 is P-type to provide NMOS FET operation. The drain terminal 42 is connected to an electrical potential $V_{DD}$ which is more positive than ground. The terminal 40 is connected to ground through a pull-down resistor 62.

A logically high signal will be assumed to be substantially equal to $V_{DD}$, and a logically low signal will be assumed to be substantially equal to ground. With any logically low input signal A, B or C applied to the gate terminal 54, 56 or 58 respectively, the device 30 will be turned off and the resistor 62 will pull the output low (to ground).

Since the device 30 provides NMOS operation in the configuration of FIG. 3, positive inputs to all of the gate terminals 54, 56 and 58 will establish a conductive channel between the terminals 40 and 42. The entire channel will be enhanced, thereby connecting the source terminal 40 to the potential $V_{DD}$ through the drain terminal 42 to produce a logically high output. In this manner, the AND gate 60 produces a logically high output when all of the inputs are high, and a logically low output when any of the inputs are low.

Figure 4:
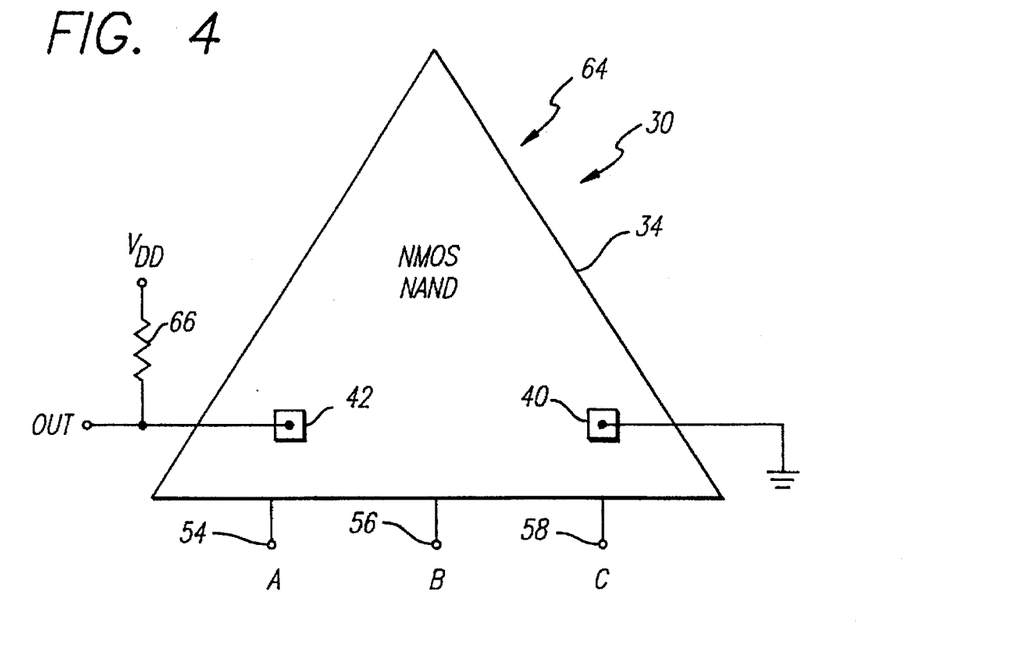
FIG. 4 is an electrical schematic diagram illustrating the gate device connected to provide a logical NAND function.

FIG. 4 illustrates the device 30 connected in circuit to function as a NAND gate 64. In this case also, the active area 36 of the device 30 is P-type to provide NMOS operation. The source terminal 40 is connected to ground, and the drain terminal 42 is connected to $V_{DD}$ through a pull-up resistor 66. The output signal OUT appears at the drain terminal 42.

When any of the inputs are low, the device 30 is turned off and the output will be pulled to $V_{DD}$ by the pull-up resistor 66 to produce a logically high output. If all of the inputs are high, a conductive channel will be established between the terminals 40 and 42 to connect the output to ground and produce a logically low output. In this manner, the output signal OUT will be high if any of the inputs are low, and low if all of the inputs are high to produce the NAND function.

Figure 5:
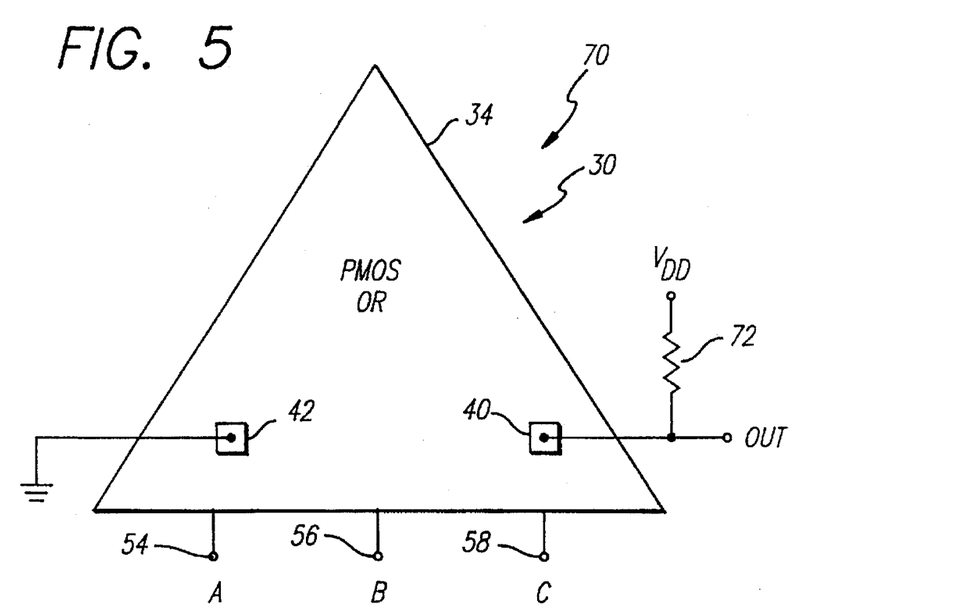
FIG. 5 is an electrical schematic diagram illustrating the gate device connected to provide a logical OR function.

An OR gate 70 incorporating the device 30 is illustrated in FIG. 5. In the OR gate configuration, the active area 36 is N-type to provide PMOS FET operation, and the drain terminal 42 is connected to ground. The source terminal 40 is connected to $V_{DD}$ through a pull-up resistor 72, and the output is taken at the source terminal 40.

Due to the PMOS configuration of the device 30 in the OR gate 70, all of the input signals A, B or C must be logically low to establish a conductive channel between the terminals 40 and 42. This connects the output to ground. Thus, all low inputs will produce a low output.

When any of the inputs is high, the device 30 is turned off, and the output is pulled high by the pull-up resistor 72. Thus, the desired OR function is provided.

Figure 6:
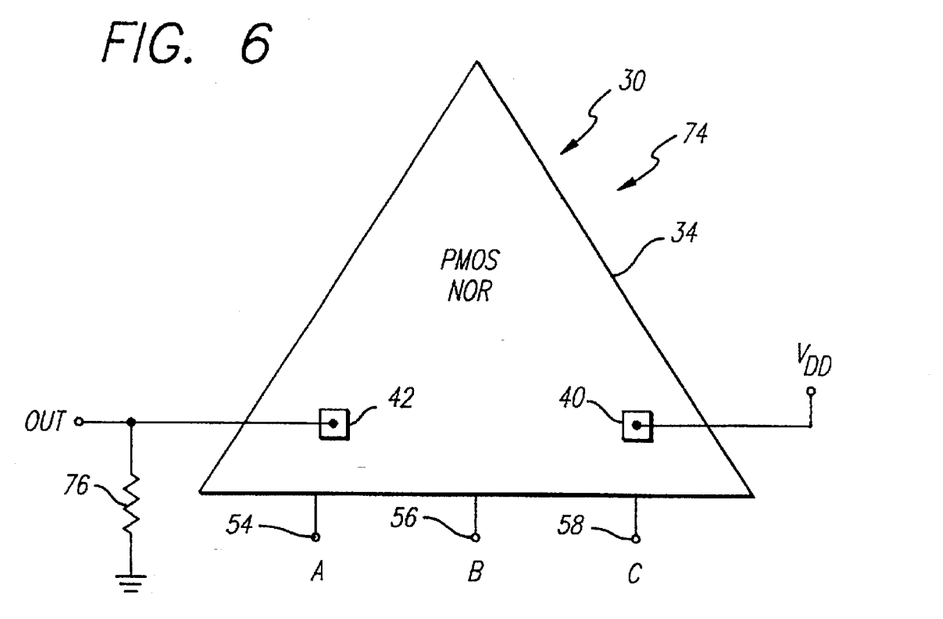
FIG. 6 is an electrical schematic diagram illustrating the gate device connected to provide a logical NOR function.

A NOR gate 74 incorporating the device 30 is illustrated in FIG. 6, in which the active area 36 is N-type to provide PMOS operation. The source terminal 40 is connected to $V_{DD}$, whereas the terminal 42 is connected to ground through a pull-down resistor 76. The output is taken at the terminals 42.

All low inputs will establish a conductive channel between the terminals 40 and 42, thereby connecting the output to $V_{DD}$ and producing a high output. When any of the inputs are high, the device 30 is turned off and the output is pulled to ground by the resistor 76. Thus, the NOR configuration is provided, in which any high input produces a low output, and the output is high in response to all inputs being low.

The device 30 is illustrated as having three inputs, which is ideally suited to the triangular device shape. However, it is within the scope of the invention to provide a gate device having one or two inputs. A device with one input can be used as a buffer or an inverter.

The device 30 can be configured without modification to operate as if it had one or two, rather than three inputs. For example, if it is desired to operate the AND gate 60 of FIG. 3 with only two inputs, the gate terminal 58 can be connected to $V_{DD}$ and the two inputs applied to the gate terminals 54 and 56. The OR gate 70 of FIG. 5 can be adapted to provide a two input configuration by connecting the gate terminal 58 to ground and applying the two inputs to the gate terminals 54 and 56.

It is also within the scope of the invention to modify the device 30 to have only one or two inputs by physically omitting one or two of the gates 48, 50 and 52 and respective terminals 54, 56 and 58.

Figure 7:
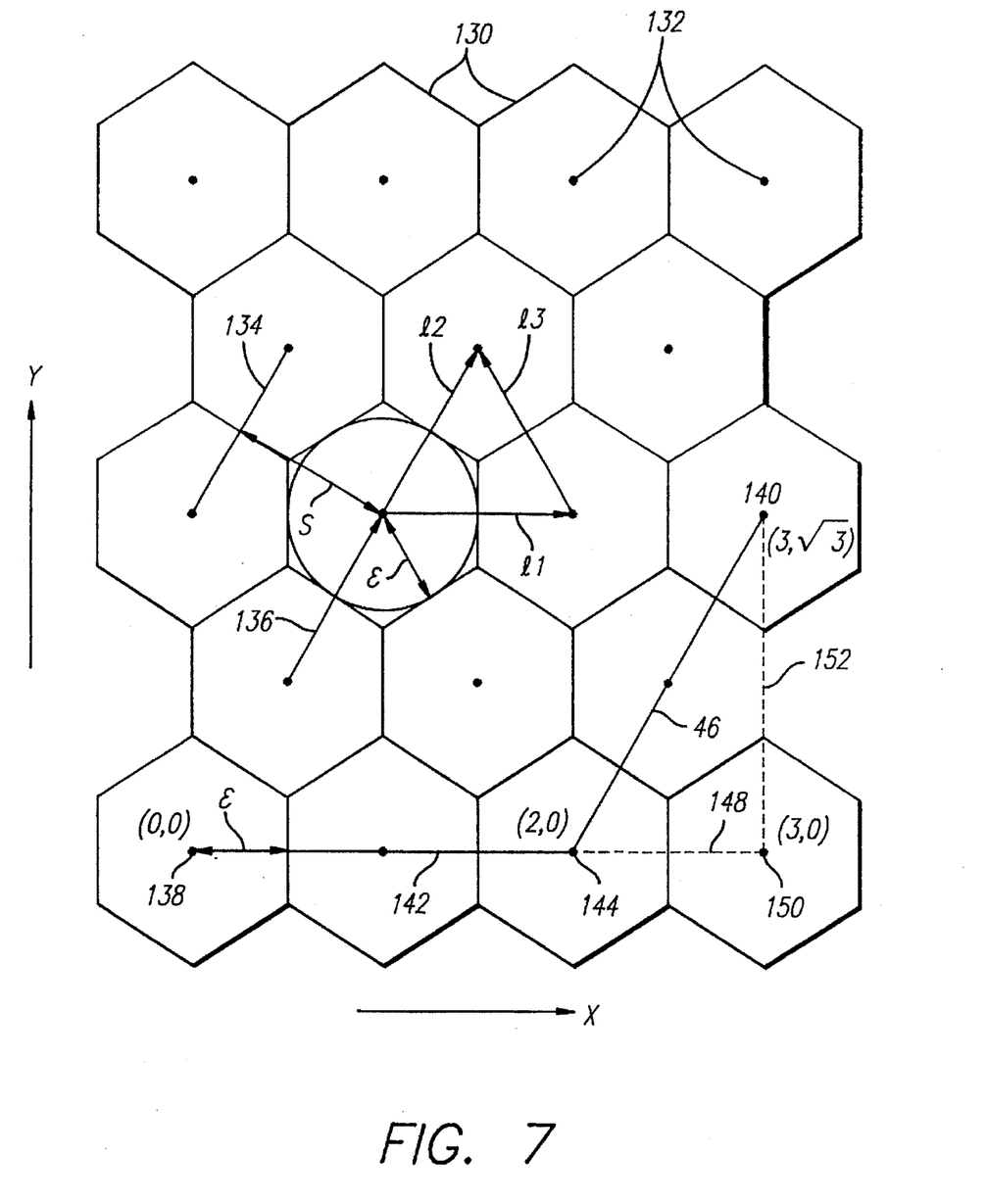
FIG. 7 is a diagram illustrating three direction routing for interconnecting the present devices based on hexagonal geometry in accordance with the present invention.

The geometry of a three directional hexagonal routing arrangement for interconnecting logic gates based on the present device 30 is illustrated in FIG. 7. An orthogonal coordinate system has an X axis and a Y axis. A closely packed pattern of small hexagons 130 is superimposed on the coordinate system, with the centers of the hexagons 130 being designated as terminal points 132.

For the purpose of the present disclosure, the term "closely packed" is construed to mean that the hexagons 130 are formed in a contiguous arrangement with adjacent hexagons 130 sharing common sides as illustrated, with no spaces being provided between adjacent hexagons 130. As will be described in detail below, logic gate devices based on the present device 30 are formed on the substrate 32 in a closely packed arrangement, each logic gate device covering a number of the small hexagons 130.

In accordance with the invention, the centers of the hexagons 130 as indicated at 132 represent interconnect points for terminals of the logic gate devices. Electrical conductors for interconnecting the points 132 extend in three directions that make angles of 60° relative to each other.

The conductors that extend in the three directions can be formed in three different layers, or alternatively the conductors that extend in two or three of the directions can be formed in a single layer as long as they do not cross.

As illustrated, a direction $e_1$ extends parallel to the X axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 7, they form an equilateral triangle. For convenience, the notation $e_1$, $e_2$ and $e_3$ is used to denote the vectors that extend in the respective routing directions as well as the directions themselves. The radius of the circles that are inscribed by the hexagons 130 is designated as $\epsilon$.

The vectors $e_1$, $e_2$ and $e_3$ can be defined using the following notation.

$$e_1 = (1,0), e_2 = [(1/2),(\sqrt{3}/2)], e_3 = e_1 - e_2.$$

The geometric structure of the present invention can also be defined using set theory. A set SIX($\alpha$, $\epsilon$) of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set SIX($\alpha$, ½) for all $\alpha$ from the set SU intersect only on the edges of the hexagons and partition the plane into the closely packed arrangement as illustrated. Circles inscribed in these hexagons are also densely packed.

As further illustrated in FIG. 7, the perpendicular distance S between two adjacent conductors extending in the direction $e_2$, such as conductors 134 and 136, is equal to $S = \sqrt{+e,fra 3/2} + ee = 0.87$ measured in X-Y coordinates, or $S = \sqrt{3}\ \epsilon = 1.73\epsilon$ The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is substantially less than with conventional rectilinear routing. As illustrated in FIG. 7, terminal points 138 and 140 to be interconnected are located at (x,y) coordinates (0,0) and (3,$\sqrt{3}$) respectively.

Using the present routing arrangement, the points 138 and 140 can be connected by a first conductor 142 extending in the direction $e_1$ from the point 138 to a point 144 at coordinates (2,0), and a second conductor 146 extending from the point 144 in the direction $e_2$ to the point 140. The length of each of the conductors 142 and 146 is 2, and the total connection length is 4.

Using the conventional rectilinear routing method, connection between the points 138 and 140 also requires the conductor 142 from the point 138 to the point 144. However, rather than the diagonal conductor 146, the conventional method requires two conductors, a conductor 148 from the point 144 to a point 150 at coordinates (3,0), and a conductor 152 from the point 150 to the point 140.

The combined length of the conductors 142 and 148 is 3, whereas the length of the conductor 152 is $\sqrt{3}$. The total length of the conventional rectilinear interconnect path is therefore $3+\sqrt{3}=4.73$. The conventional path length between the points 138 and 140 is therefore 18.3% longer than the present path length.

The reduction of 18.3% in pathlength is approximately the average that is attained using the present hexagonal routing arrangement, although individual cases can vary from this value. However, the distance between any two points using rectilinear routing cannot be shorter than that using the present hexagonal routing in any case.

Figure 8:
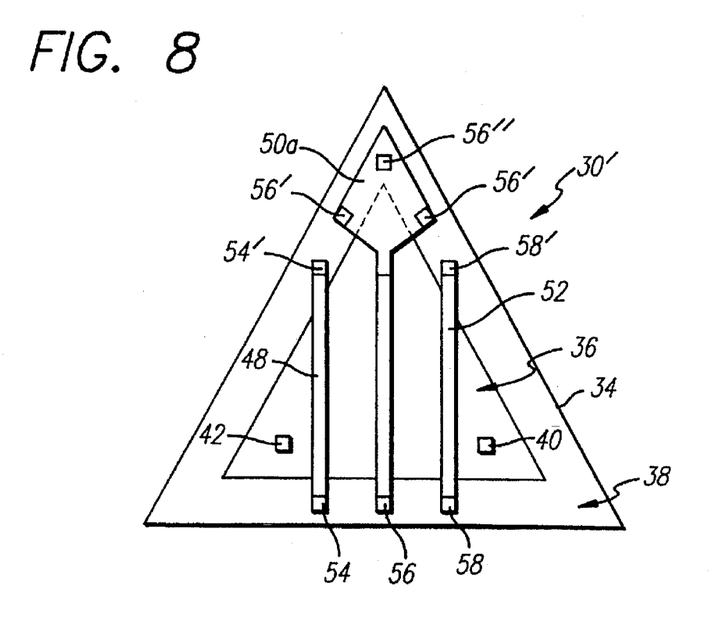
FIG. 8 is a diagram illustrating the gate device with alternative gate connections.

FIG. 8 illustrates alternative locations for the gate terminals 54, 56 and 58 in a modified device 30'. Rather than providing all of the gate terminals 54, 56 and 58 adjacent to the lower edge of the triangle, it is within the scope of the invention to provide gate terminals 54', 56' and 58' at the upper end portions of the gates 48, 50 and 52 respectively.

It is also within the scope of the invention to provide a gate terminal 56" adjacent to the upper vertex of the quadrilateral 50a. In general, the gate terminals can be formed at any desired location as long as they electrically interconnect with the gates.

Figure 9:
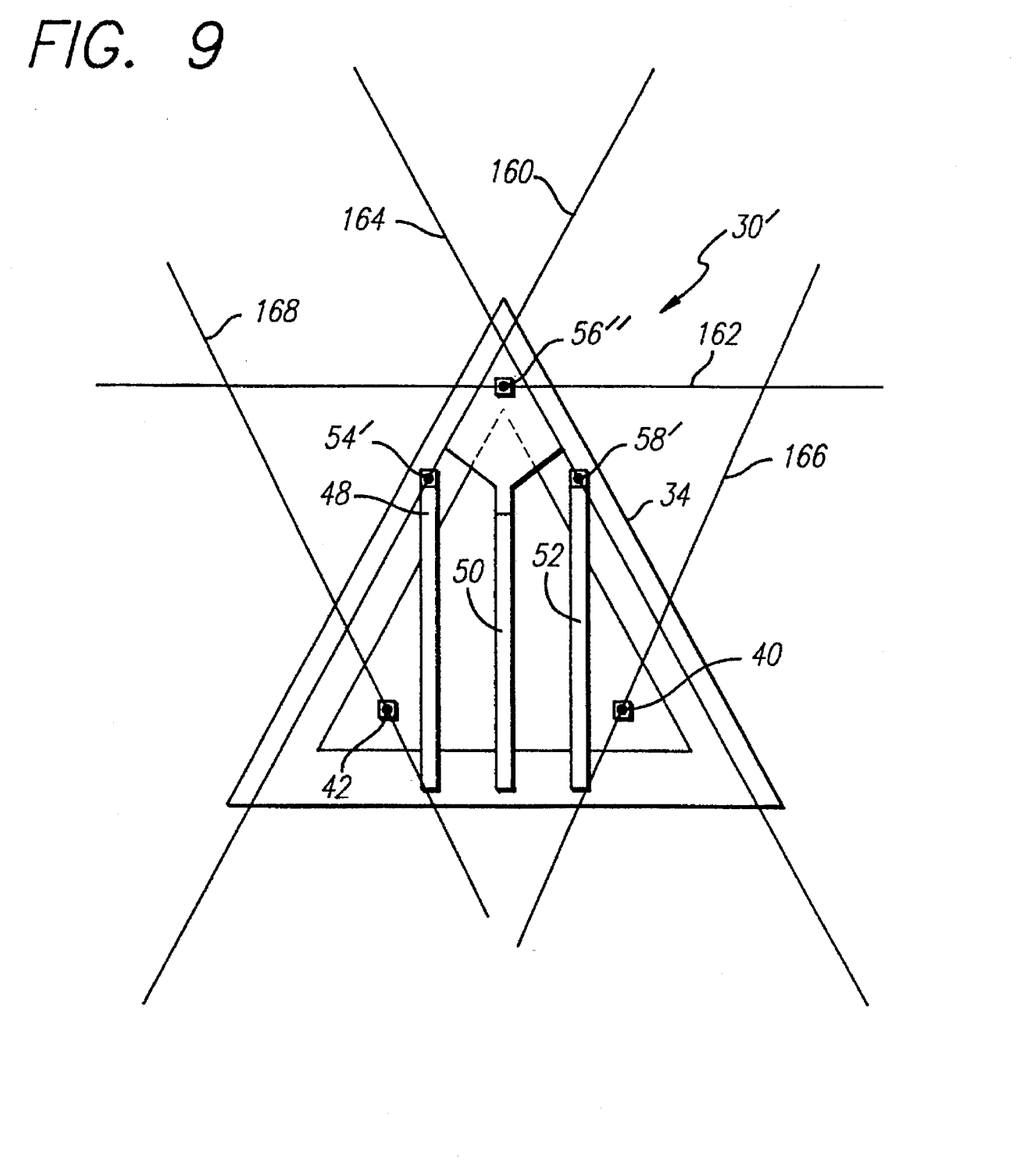
FIG. 9 is a diagram illustrating one device as connected using the three direction routing of FIG. 7.

An example of the device 30 as being interconnected using the hexagonal routing arrangement of FIG. 7 is illustrated in FIG. 9. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30.

In the illustrated example, a conductor 160 which extends in the direction $e_2$ is provided for interconnecting the gate terminal 54' for the input A. A conductor 162 which extends in the direction $e_1$ is provided for interconnecting the gate terminal 56" for the input B, whereas a conductor 164 which extends in the direction $e_3$ is provided for interconnecting the gate terminal 58' for the input C.

Conductors 166 and 168 which extend in the directions $e_2$ and $e_3$ are provided for interconnecting the source terminal 40 and drain terminal 42 respectively.

The conductors 160, 162 and 164 are preferably provided in three separate wiring layers respectively. The conductors 166 and 168 are preferably provided in another wiring layer or conductive plane.

Figure 10:
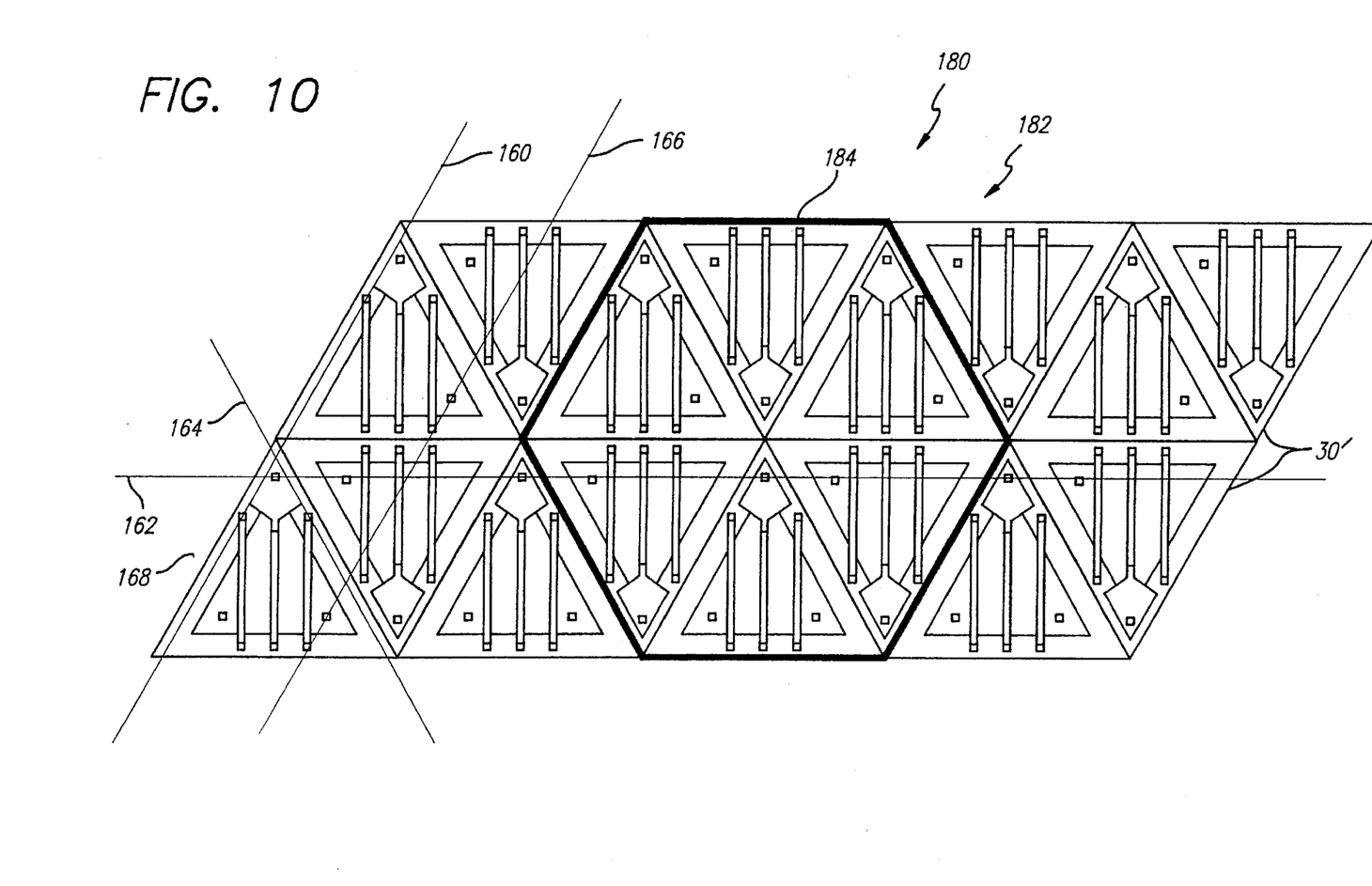
FIG. 10 is a diagram illustrating a microelectronic integrated circuit including a plurality of the present gate devices in a closely packed triangular arrangement.

FIG. 10 illustrates a microelectronic integrated circuit 180 according to the present invention comprising a semiconductor substrate 182 on which a plurality of the devices 30' are formed in a closely packed triangular arrangement. Further shown are a few illustrative examples of interconnection of the devices using the conductors 160, 162, 164, 166 and 168 which extend in the three directions described with reference to FIG. 9.

It will be noted that six closely packed devices 30 define a hexagonal shape having a periphery 184. This relationship can be used within the scope of the invention to provide unit cells having hexagonal shapes defined by closely packed triangles, with internal structures similar to or different from that those which are explicitly described and illustrated. In such an arrangement, the hexagon can be considered to be the basic building block.

It will be understood from the above description that the present gate device geometry and three direction interconnect arrangement substantially reduce the total wirelength interconnect congestion of the integrated circuit by providing three routing directions, rather than two as in the prior art. The three routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

Various modifications will become possible for those skilled in the art after receiving the teachings of the present disclosure without departing from the scope thereof.

For example, it will be understood that the terms "source" and "drain" as applied to field effect transistors merely define opposite ends of a channel region which is controlled by a voltage applied to a gate. The source and drain are interchangeable in that current may flow into either one and out of the other.

Therefore, the terms "source" and "drain", and the relative polarities of voltages applied thereto, as used in the present specification, are arbitrary and reversible within the scope of the invention, and are not to be considered as limiting the invention to one or the other of the possible configurations of polarities.

Figures 11, 12, 13, 14:
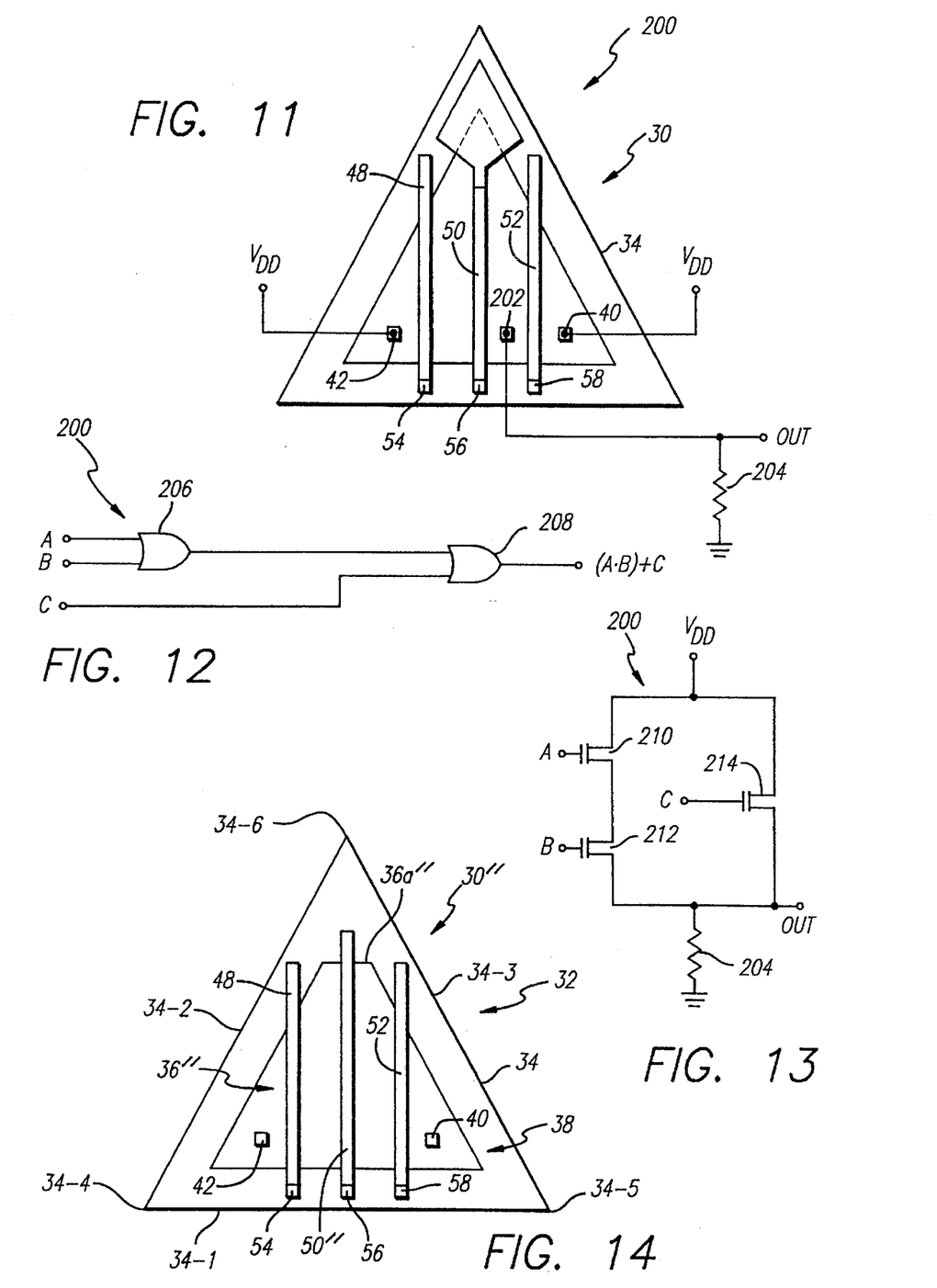
FIG. 11 is a diagram illustrating the gate device connected to provide a logical AND/OR function.
FIG. 12 is a schematic diagram illustrating the logical functionality of the device connected as shown in FIG. 11.
FIG. 13 is a schematic diagram illustrating how individual field effect transistors of the device are connected as shown in FIG. 11.
FIG. 14 is a diagram illustrating the gate device as having a modified gate configuration.

FIGS. 11 to 13 illustrate how the device 30 can be modified to provide a different logical function. In an AND/OR gate 200, a third terminal 202 is formed between the gates 50 and 52.

In the gate 200, the first and second terminals 40 and 42 are connected to $V_{DD}$ to constitute drain terminals, and the output signal OUT appears at the third terminal 202 which functions as a source terminal and is connected to ground through a pull-down resistor 204.

The gate 200 provides the logical function (A·B)+C. As illustrated in the equivalent circuit diagram of FIG. 12, the inputs A and B are applied to inputs of an AND gate 206, the output of which is applied to an input of an OR gate 208. The input C is applied to another input of the OR gate 208, whereby the output of the OR gate 208 is (A·B)+C.

The gates 48 and 50 are both disposed between the terminals 42 and 202, and high inputs must be applied to both respective gate terminals 54 and 56 to enhance the entire portion of the channel between the terminals 42 and 202 to connect the terminal 202 to $V_{DD}$ via the terminal 42 and produce a high output signal OUT.

However, only the gate 52 is disposed between the terminals 40 and 202, such that a high signal applied to the gate terminal 58 alone is sufficient to connect the terminal 202 to $V_{DD}$ via the terminal 40.

In this manner, the output of the gate 200 will be logically high if the inputs A and B are both high, and/or the input C is logically high, and the output of the gate 200 will be logically low if either of the inputs A and B are low, and the input C is low.

The gate 200 is illustrated in the form of equivalent FET transistors in FIG. 13. The functionality of an FET 210 is provided by the second terminal 42 and the first gate 48 as shown in FIG. 11. The functionality of an FET 212 is provided by the second terminal 42 and second gate 50, whereas the functionality of an FET 214 is provided by the first terminal 40 and the third gate 52.

Similar operation can be obtained by providing the third terminal between the gates 48 and 50. The principle is that by providing an output terminal internal between two of the gates and connecting the first and second terminals 40 and 41 to $V_{DD}$, a high input signal applied to one of the gates can produce a high output, whereas high input signals applied to the other two gates are alternatively required to produce a high output.

It will be noted that reversal of source and drain connections to provide alternative logic functions is possible for all embodiments of the invention as described above.

Space in the present triangular AND gate device is used most efficiently in the illustrated configuration, in which the terminals 40 and 42 are disposed adjacent to the vertices of the triangle and the gate terminals 48, 50 and 52 are disposed adjacent to the edges of the triangular periphery 34.

However, the present invention is not so limited, and it is possible to locate the terminals adjacent to the edges, and locate the gate terminals adjacent to the vertices of the triangular periphery 34. Other arrangements of the terminals, although not explicitly illustrated, are possible within the scope of the invention.

Another modification of the present gate device is illustrated in FIG. 14, and designated as 30". As described above, manufacturing problems can be encountered if the upper end of the gate 50 extends through the upper vertex of the triangular active area 36. FIG. 14 illustrates an alternative method of overcoming this problem, in which the upper vertex of the active area 36" is truncated to form a horizontal edge 36a", and the upper portion of the gate 50 extends perpendicularly through the edge 36a".

I claim:

1. A microelectronic device formed on a semiconductor substrate, the device having a periphery defined by a triangle and comprising:

an active area formed within said periphery;

a first terminal formed in said active area;

a second terminal which is formed in said active area and spaced from the first terminal;

a first gate formed between the first terminal and the second terminal; and a channel connecting said first and second terminals, the channel being controlled by a voltage applied to said first gate.

2. A device as in claim 1, in which:

the device is a Metal-Oxide-Semiconductor (MOS) device; and the first gate comprises:
an insulating oxide layer formed over the substrate; and
a conductive metal layer formed over the oxide layer.

3. A device as in claim 1, further comprising an inactive area disposed between said active area and said periphery, in which the first gate has opposite end portions that extend into said inactive area.

4. A microelectronic device formed on a semiconductor substrate, the device having a periphery defined by a triangle and comprising:

an active area formed within said periphery;

a first terminal formed in said active area;

a second terminal which is formed in said active area and spaced from the first terminal; and an inactive area disposed between said active area and said periphery.

5. A device as in claim 4, further comprising a first gate terminal which is formed in said inactive area and connected to the first gate.

6. A device as in claim 4, further comprising:

a second gate formed between the first gate and the second terminal; and a pull-down resistor, in which:

said active area is N-type;

the first terminal constitutes a source terminal and is connected to a first potential through the pull-down resistor;

the second terminal constitutes a drain terminal and is connected to a second potential which is more positive than said first potential; and the device provides an AND function with inputs applied to the first and second gates and an output taken from the first terminal.

7. A device as in claim 4, further comprising:

a second gate formed between the first gate and the second terminal; and a pull-up resistor, in which:

said active area is N-type;

the first terminal constitutes a source terminal and is connected to a first potential;

the second terminal constitutes a drain terminal and is connected to a second potential which is more positive than said first potential through the pull-up resistor; and the device provides an NAND function with inputs applied to the first and second gates and an output taken from the second terminal.

8. A device as in claim 4, further comprising:

a second gate formed between the first gate and the second terminal; and a pull-up resistor, in which:

said active area is P-type;

the first terminal constitutes a source terminal and is connected to a first potential through the pull-up resistor;

the second terminal constitutes a drain terminal and is connected to a second potential which is more negative than said first potential; and the device provides an OR function with inputs applied to the first and second gates and an output taken from the first terminal.

9. A device as in claim 4, further comprising:

a second gate formed between the first gate and the second terminal; and a pull-down resistor, in which:

said active area is P-type;

the first terminal constitutes a source terminal and is connected to a first potential;

the second terminal constitutes a drain terminal and is connected to a second potential which is more negative than said first potential through the pull-down resistor; and the device provides a NOR function with inputs applied to the first and second gates and an output taken from the second terminal.

10. A microelectronic device formed on a semiconductor substrate, the device having a periphery defined by a triangle and comprising:

an active area formed within said periphery;

a first terminal formed in said active area;

a second terminal which is formed in said active area and spaced from the first terminal;

in which:

said triangle has first, second and third vertices; and the first and second terminals are formed adjacent to said first and second vertices, respectively.

11. A device as in claim 10, further comprising:

an inactive area disposed between said active area and said periphery; and a first gate terminal which is formed in said inactive area and connected to the first gate, the first gate terminal being formed adjacent to an edge of said triangle between said first and second vertices.

12. A microelectronic device formed on a semiconductor substrate, the device having a periphery defined by a triangle and comprising:

an active area formed within said periphery;

a first terminal formed in said active area;

a second terminal which is formed in said active area and spaced from the first terminal; and a second gate formed between said first gate and the second terminal.

13. A device as in claim 12, further comprising a third gate formed between the second gate and the second terminal.

14. A device as in claim 13, further comprising:

an inactive area disposed between said active area and said periphery; and first, second and third gate terminals which are formed in said inactive area and connected to the first, second and third gates respectively.

15. A device as in claim 14, in which:

said triangle has first, second and third vertices;

the first and second terminals are formed adjacent to said first and second vertices respectively; and the first, second and third gate terminals are spaced from each other adjacent to an edge of said triangle between said first and second vertices.

16. A microelectronic device formed on a semiconductor substrate, the device having a periphery defined by a triangle and comprising:

an active area formed within said periphery;

a first terminal formed in said active area;

a second terminal which is formed in said active area and spaced from the first terminal;

a first gate formed between the first terminal and the second terminal;

a second gate formed between the first gate and the second terminal;

a third gate formed between the second gate and the second terminal; and a third terminal formed between the second and third gates.

17. A device as in claim 16, further comprising an inactive area disposed between said active area and said periphery.

18. A device as in claim 17, further comprising first, second and third gate terminals which are formed in said inactive area and are connected to the first, second and third gates respectively.

19. A device as in claim 16, in which:

the first and second terminals constitute source terminals; and the third terminal constitutes a drain terminal.

20. A device as in claim 16, in which:

the first and second terminals constitute drain terminals; and the third terminal constitutes a source terminal.

21. A device as in claim 16, in which:

said triangle comprises first, second and third vertices; and the first and second terminals are formed adjacent to said first and second vertices respectively.

22. A microelectronic integrated circuit, comprising:

a semiconductor substrate; and a plurality of microelectronic devices formed on the substrate, each device having a periphery defined by a triangle and comprising:

an active area formed within said periphery;

a first terminal formed in said active area;

a second terminal which is formed in said active area and spaced from the first terminal;

a first gate formed between the first terminal and the second terminal; and a channel connecting said first and second terminals, the channel being controlled by a voltage applied to said first gate.

23. An integrated circuit as in claim 22, in which at least one of said devices is a Metal-Oxide-Semiconductor (MOS) device, in which:

the first gate comprises:

an insulating oxide layer formed over the substrate; and a conductive metal layer formed over the oxide layer.

24. A microelectronic integrated circuit, comprising:

a semiconductor substrate; and a plurality of microelectronic devices formed on the substrate, each device having a periphery defined by a triangle and comprising:

an active area formed within said periphery;

a first terminal formed in said active area;

a second terminal which is formed in said active area and spaced from the first terminal; and a first gate formed between the first terminal and the second terminal;

in which at least one of said devices further comprises an inactive area disposed between said active area and said periphery.

25. An integrated circuit as in claim 24, in which at least one of said devices further comprises:

a second gate formed between the first gate and the second terminal; and a pull-down resistor, in which:

said active area is N-type;

the first terminal constitutes a source terminal and is connected to a first potential through the pull-down resistor;

the second terminal constitutes a drain terminal and is connected to a second potential which is more positive than said first potential; and the device provides an AND function with inputs applied to the first and second gates and an output taken from the first terminal.

26. An integrated circuit as in claim 24, in which at least one of said devices further comprises:

a second gate formed between the first gate and the second terminal; and a pull-up resistor, in which:

said active area is N-type;

the first terminal constitutes a source terminal and is connected to a first potential;

the second terminal constitutes a drain terminal and is connected to a second potential which is more positive than said first potential through the pull-up resistor; and the device provides an NAND function with inputs applied to the first and second gates and an output taken from the second terminal.

27. An integrated circuit as in claim 24, in which at least one of said devices further comprises:

a second gate formed between the first gate and the second terminal; and a pull-up resistor, in which:

said active area is P-type;

the first terminal constitutes a source terminal and is connected to a first potential through the pull-up resistor;

the second terminal constitutes a drain terminal and is connected to a second potential which is more negative than said first potential; and the device provides an OR function with inputs applied to the first and second gates and an output taken from the first terminal.

28. An integrated circuit as in claim 24, in which at least one of said devices further comprises:

a second gate formed between the first gate and the second terminal; and a pull-down resistor, in which:

said active area is P-type;

the first terminal constitutes a source terminal and is connected to a first potential;

the second terminal constitutes a drain terminal and is connected to a second potential which is more negative than said first potential through the pull-down resistor; and the device provides a NOR function with inputs applied to the first and second gates and an output taken from the second terminal.

29. A microelectronic integrated circuit, comprising:

a semiconductor substrate; and a plurality of microelectronic devices formed on the substrate, each device having a periphery defined by a triangle and comprising:

an active area formed within said periphery;

a first terminal formed in said active area;

a second terminal which is formed in said active area and spaced from the first terminal; and a first gate formed between the first terminal and the second terminal;

in which said at least one of said devices further comprises a first gate terminal which is formed in said inactive area and connected to the first gate.

30. A microelectronic integrated circuit, comprising:

a semiconductor substrate; and a plurality of microelectronic devices formed on the substrate, each device having a periphery defined by a triangle and comprising:

an active area formed within said periphery;

a first terminal formed in said active area;

a second terminal which is formed in said active area and spaced from the first terminal; and a first gate formed between the first terminal and the second terminal;

in which:

said triangle has first, second and third vertices; and the first and second terminals are formed adjacent to said first and second vertices respectively.

31. An integrated circuit as in claim 30, in which at least one of said devices further comprises:

an inactive area disposed between said active area and said periphery; and a first gate terminal which is formed in said inactive area and connected to the first gate, the first gate terminal being formed adjacent to an edge of said triangle between said first and second vertices.

32. A microelectronic integrated circuit, comprising:

a semiconductor substrate; and a plurality of microelectronic devices formed on the substrate, each device having a periphery defined by a triangle and comprising:

an active area formed within said periphery;

a first terminal formed in said active area;

a second terminal which is formed in said active area and spaced from the first terminal; and a first gate formed between the first terminal and the second terminal;

in which at least one of said devices further comprises a second gate formed between the first gate and the second terminal.

33. An integrated circuit as in claim 32, in which said at least one of said devices further comprises a third gate formed between the second gate and the second terminal.

34. An integrated circuit as in claim 33, in which said at least one of said devices further comprises:

an inactive area disposed between said active area and said periphery; and first, second and third gate terminals which are formed in said inactive area and connected to the first, second and third gates respectively.

35. An integrated circuit as in claim 34, in which:

said triangle has first, second and third vertices;

the first and second terminals are formed adjacent to said first and second vertices respectively; and the first, second and third gate terminals are spaced from each other adjacent to an edge of said triangle between said first and second vertices.

36. A microelectronic integrated circuit, comprising:

a semiconductor substrate; and a plurality of microelectronic devices formed on the substrate, each device having a periphery_ defined by a triangle and comprising:

an active area formed within said periphery;

a first terminal formed in said active area;

a second terminal which is formed in said active area and spaced from the first terminal; and a first gate formed between the first terminal and the second terminal;

in which:

at least one of said devices further comprises an inactive area disposed between said active area and said periphery; and the first gate has opposite end portions that extend into said inactive area.

37. A microelectronic integrated circuit, comprising:

a semiconductor substrate; and a plurality of microelectronic devices formed on the substrate, each device having a periphery_ defined by a triangle and comprising:

an active area formed within said periphery;

a first terminal formed in said active area;

a second terminal which is formed in said active area and spaced from the first terminal; and a first gate formed between the first terminal and the second terminal;

in which:

said devices are closely packed on the substrate; and the circuit further comprises interconnect wiring for electrically interconnecting the first terminals, second terminals and first gates of said devices in a predetermined manner, the wiring comprising electrical conductors that extend in three directions that are angularly displaced from each other by 60°.

38. An integrated circuit as in claim 37, in which at least one of said devices further comprises:

an inactive area disposed between said active area and said periphery;

a second gate formed between the first gate and the second terminal;

a third gate formed between the second gate and the second terminal; and first, second and third gate terminals which are formed in said inactive area and connected to the first, second and third gates respectively;

said interconnect wiring further comprising electrical conductors for interconnecting the first and second terminals, and the first, second and third gates in said predetermined manner.

* * * * *